US012796477B2

(12) United States Patent
Mahoney et al.

(10) Patent No.: US 12,796,477 B2
(45) Date of Patent: Nov. 10, 2026

(54) RF COMPONENT WITH INTEGRATED EMI SHIELDING

(71) Applicant: Applied Optoelectronics, Inc., Sugar Land, TX (US)

(72) Inventors: William G. Mahoney, Suwanee, GA (US); Steven Blashewski, Duluth, GA (US); Stephane Chapeau, Duluth, GA (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 482 days.

(21) Appl. No.: 18/530,904

(22) Filed: Dec. 6, 2023

(65) Prior Publication Data

US 2025/0192067 A1 Jun. 12, 2025

(51) Int. Cl.

| | |
|---|---|
| ***H10W 42/20*** | (2026.01) |
| ***H03F 3/195*** | (2006.01) |
| ***H04B 1/00*** | (2006.01) |
| ***H10W 44/20*** | (2026.01) |

(52) U.S. Cl.

CPC ............ *H10W 42/20* (2026.01); *H03F 3/195* (2013.01); *H04B 1/0057* (2013.01); *H10W 44/20* (2026.01); *H03F 2200/451* (2013.01); *H10W 44/248* (2026.01)

(58) Field of Classification Search

None

See application file for complete search history.

(56) References Cited

U.S. PATENT DOCUMENTS

| | | | | |
|---|---|---|---|---|
| 2009/0046442 A1* | 2/2009 | Mills | H05K 9/006 | 361/818 |
| 2011/0255850 A1* | 10/2011 | Dinh | B32B 17/061 | 396/176 |
| 2015/0264842 A1* | 9/2015 | Song | H05K 7/20445 | 29/840 |
| 2021/0280956 A1* | 9/2021 | Holland | G02B 6/4416 | |

* cited by examiner

*Primary Examiner* — Bo B Jang

(74) *Attorney, Agent, or Firm* — Secant IP, P.L.L.C.

(57) ABSTRACT

An RF component with integrated EMI shielding may be used in an RF amplifier. The RF component includes a component housing made of a dielectric material, an RF component circuit, and an EMI shield integrated with the component housing for shielding the RF component circuit. The EMI shield may include a shielding portion located in the component housing and spaced from the RF component circuit by a predetermined distance and engaging members extending from the shielding portion inside the component housing to outside of the component housing. The engaging members contact an amplifier chassis for securing the RF component to the amplifier chassis and for grounding the EMI shield to the amplifier chassis. One example of the RF component includes a diplexer.

20 Claims, 10 Drawing Sheets

RF COMPONENT WITH INTEGRATED EMI SHIELDING

TECHNICAL FIELD

The present disclosure relates to RF components with integrated EMI shielding, and more particularly, to a diplexer with integrated EMI shielding for use in an RF amplifier.

BACKGROUND INFORMATION

RF amplifiers are used to amplify RF (radio frequency) signals in communication systems, such as a CATV system that provides both downstream (forward) signals to subscriber locations and upstream (reverse) signals from subscriber locations. In a hybrid fiber-coaxial (HFC) network providing CATV services, for example, optical communication is provided over optical fibers between a headend/hub and an optical node and electrical RF communication is provided over coaxial cables between the optical node and the subscriber locations. In such HFC networks, RF amplifiers are used after the optical node to extend the transmission distance of the RF signals and thus extend the reach of the CATV services provided to subscriber locations.

As the bandwidth of communication systems continues to increase and the RF amplifiers are required to handle higher frequencies (e.g., up to 1.8 GHZ), electromagnetic interference (e.g., cross-talk and RF leaking) becomes a bigger problem. Providing EMI shielding of components in the RF amplifier presents challenges, especially given the limited space within the amplifier housings and on the circuit boards in the RF amplifiers. An example of RF components that may need to be shielded includes the diplexers (also referred to as diplex filters) used in the RF amplifier to separate forward and reverse RF signals for amplification in the RF amplifier.

SUMMARY

Consistent with one aspect of the present disclosure, an RF amplifier includes an amplifier chassis and amplifier circuitry supported by the amplifier chassis and coupled to an RF signal path. The amplifier circuitry includes at least one RF component for receiving at least one RF signal carried on the RF signal path. The at least one RF component includes a component housing made of a dielectric material, an RF component circuit at least partially disposed in the component housing, and an EMI shield. The EMI shield includes a shielding portion located in the component housing and spaced from the RF component circuit. The EMI shield also includes engaging members extending from the shielding portion inside the component housing to outside of the component housing. The engaging members contact the amplifier chassis for securing the RF component to the amplifier chassis and for grounding the EMI shield to the amplifier chassis.

Consistent with another aspect of the present disclosure, an EMI-shielded diplexer includes a housing made of a dielectric material, a diplexer circuit at least partially disposed in the housing, and an EMI shield. The EMI shield includes a shielding portion located in the housing and spaced from the diplexer circuit. The EMI shield also includes engaging members extending from the shielding portion inside the housing to outside of the housing. The engaging members are configured to contact a chassis that receives the diplexer for securing the diplexer to the chassis and for grounding the EMI shield to the chassis.

BRIEF DESCRIPTION OF THE DRAWINGS

These and other features and advantages will be better understood by reading the following detailed description, taken together with the drawings wherein.

DETAILED DESCRIPTION

Figure 1:
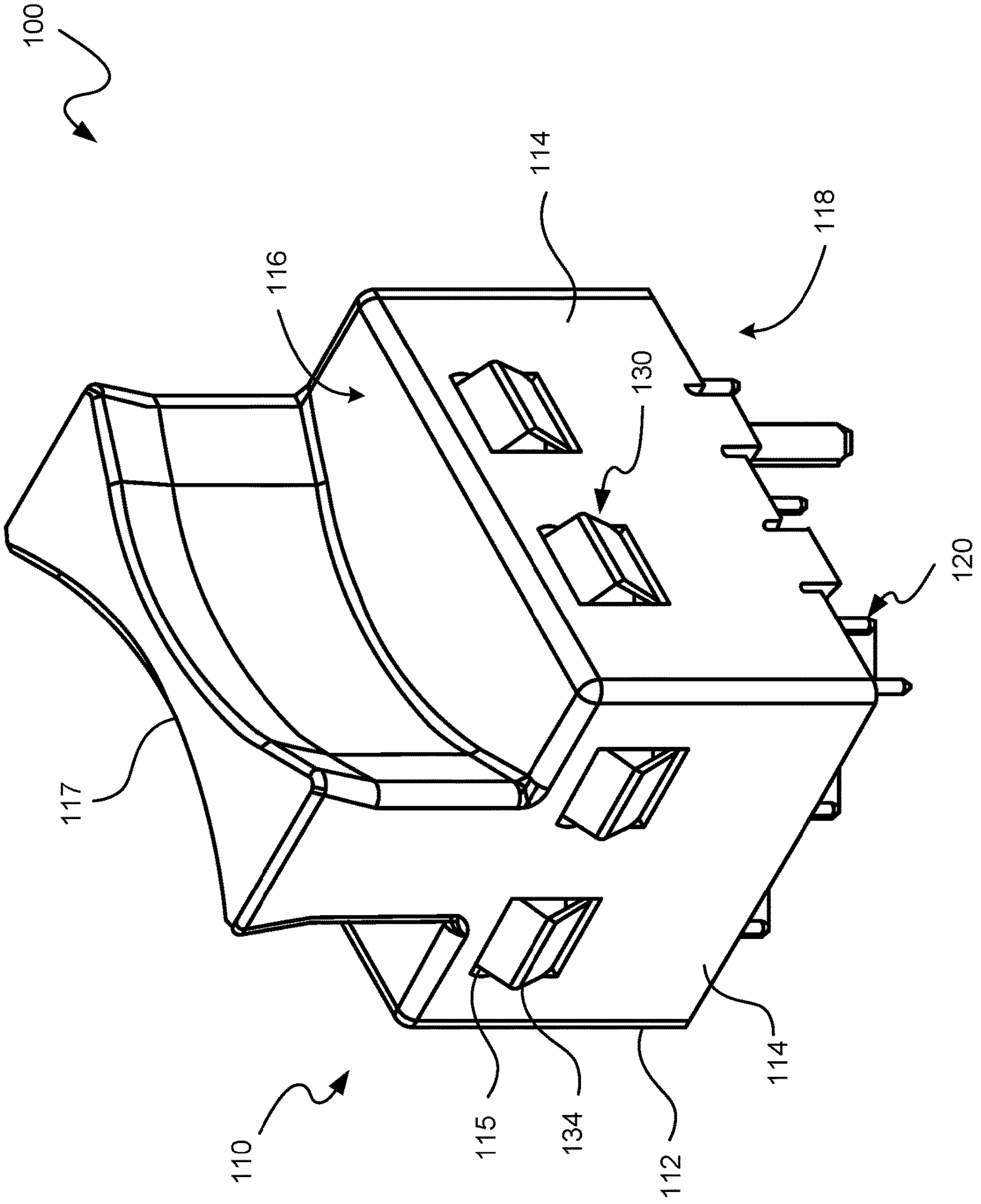
FIG. 1 is a top perspective view of an RF component with integrated EMI shielding, consistent with embodiments of the present disclosure.
Figure 2:
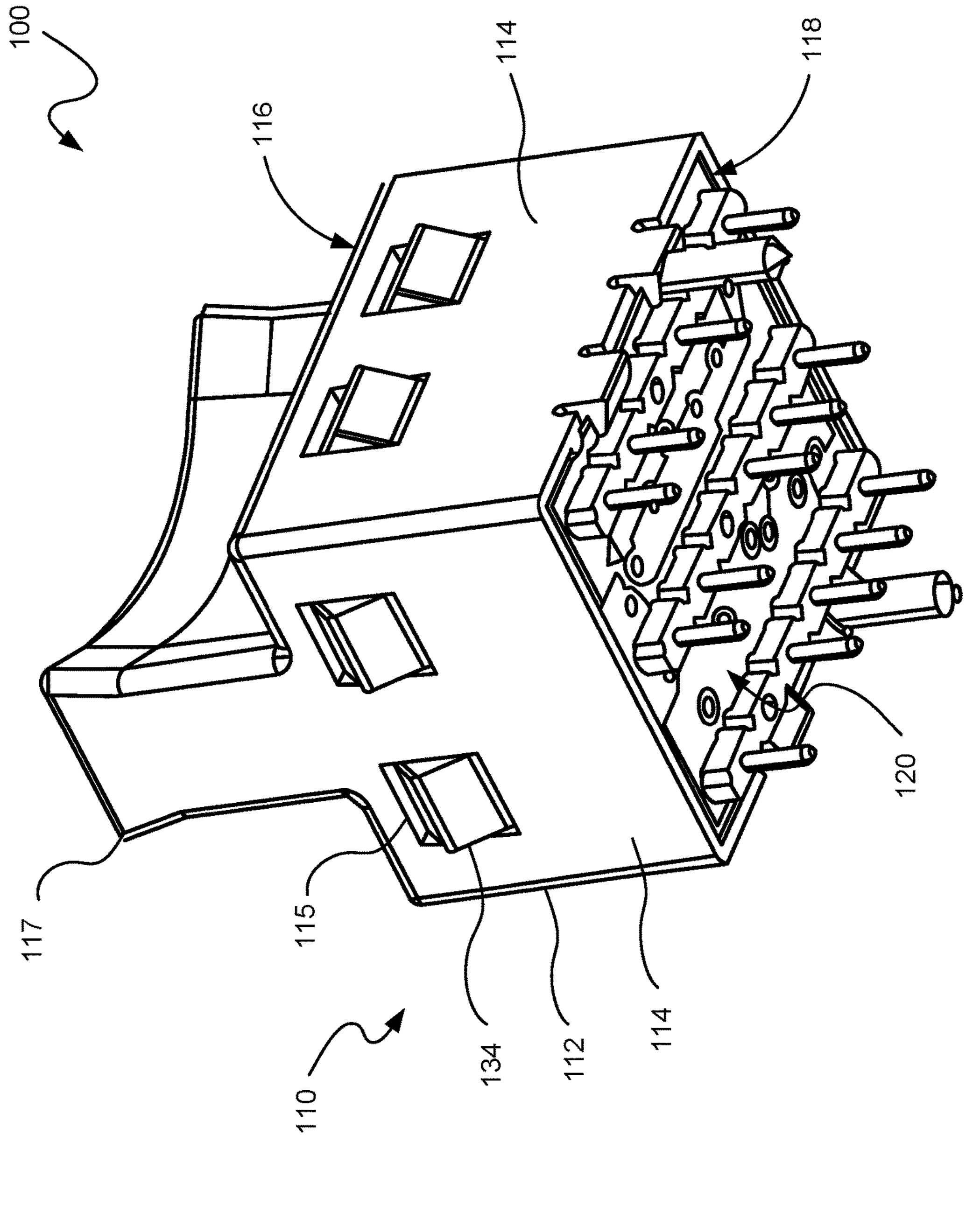
FIG. 2 is a bottom perspective view of the RF component with integrated EMI shielding shown in FIG. 1.
Figure 3:
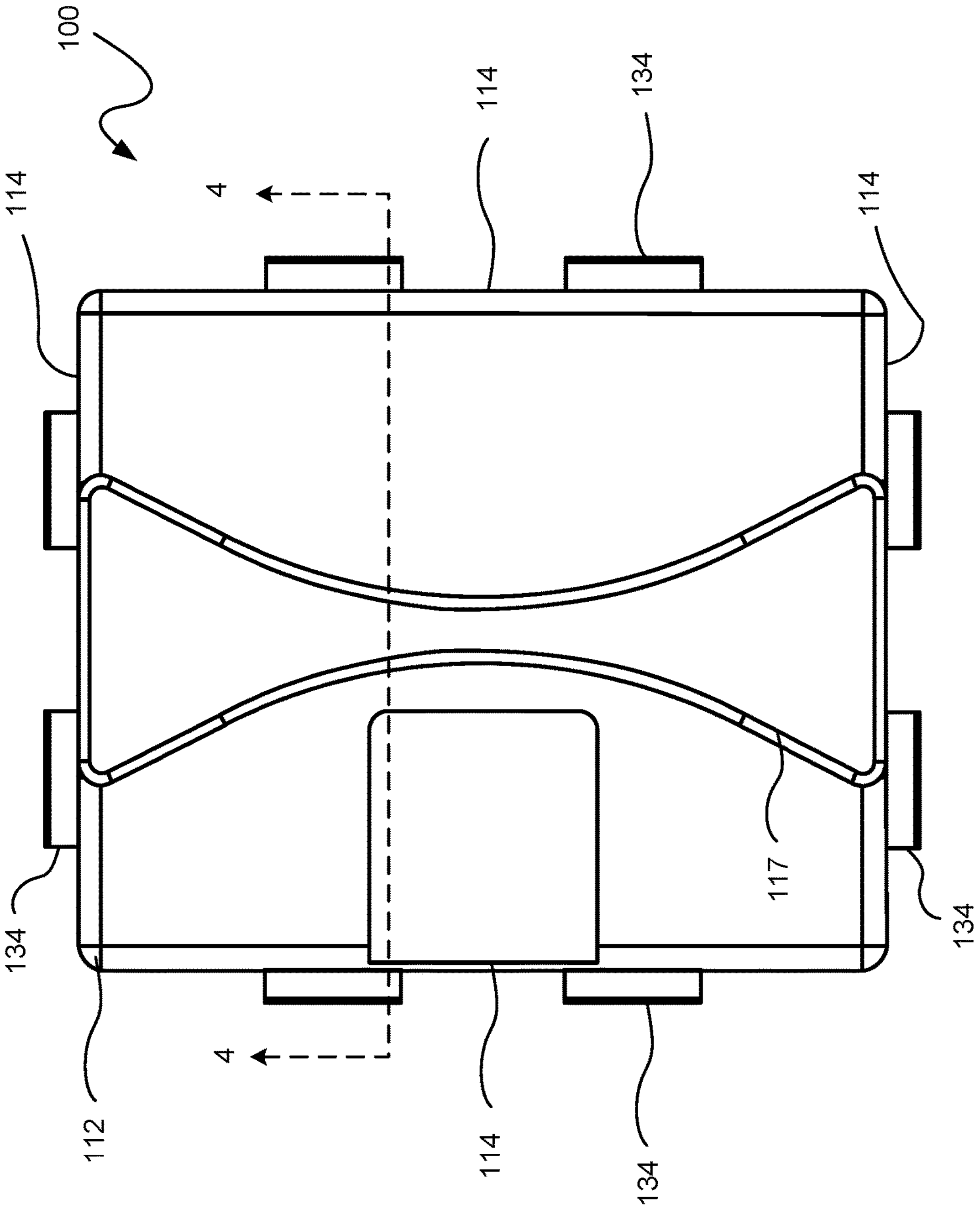
FIG. 3 is a top view of the RF component with integrated EMI shielding shown in FIG. 1.

An RF component with integrated EMI shielding, consistent with the present disclosure, may be used in an RF amplifier. The RF component includes a component housing made of a dielectric material, an RF component circuit, and an EMI shield integrated with the component housing for shielding the RF component circuit. The EMI shield may include a shielding portion located in the component housing and spaced from the RF component circuit by a predetermined distance and engaging members extending from the shielding portion inside the component housing to outside of the component housing. The engaging members contact an amplifier chassis for securing the RF component to the amplifier chassis and for grounding the EMI shield to the amplifier chassis. One example of the RF component includes a diplexer.

The RF component with integrated EMI shielding may be used in an RF amplifier, such as a line extender (LE) amplifier in a hybrid fiber-coaxial (HFC) network providing CATV services. Such an RF amplifier may be capable of amplifying RF signals up to 1.8 GHz. At those higher frequencies (e.g., 1.8 GHz or higher) RF cross-talk and leaking may be problem in the RF components, such as diplexers, that receive the RF signals. Previous attempts at shielding the diplexers have involved adding an extra layer of metal on top of the diplexer housing. These separate shields must be unscrewed to access the diplexer and may be lost and/or not reinstalled properly when a technician in the field is troubleshooting the amplifier. Providing an integrated EMI shield may provide improved EMI shielding by shorting unnecessary RF signals to ground (e.g., to the amplifier chassis) while also allowing the EMI shield to be removed together with the diplexer (or other shielded RF component) as a single unit. One challenge with an integrated EMI shield is locating the EMI shield relative to the RF component circuit (e.g., the diplexer circuit) to short the unnecessary RF signals without shorting the useful RF signals.

As used herein, the term "coupled" refers to any connection, coupling, link or the like between elements. Such "coupled" elements are not necessarily directly connected to one another and may be separated by intermediate components.

Referring to FIGS. 1-5, an embodiment of an RF component 100 with integrated EMI shielding is shown and described in greater detail. The RF component 100 may generally include a component housing 110 made of dielectric material, such as plastic, an RF component circuit 120 at least partially disposed in the component housing 110, and an EMI shield 130 integrated with the component housing 110. In the illustrated embodiment, the component housing 110 includes a body portion 112 having a rectangular shape with side walls 114 defining apertures 115, a closed top end 116 and an open bottom end 118. The component housing 110 may also include a gripping portion 117 extending from the closed top end 116 to allow the user to easily grip the RF component 100 for removal and/or insertion. Other shapes and configurations for the component housing are contemplated and within the scope of the present disclosure.

Figure 4:
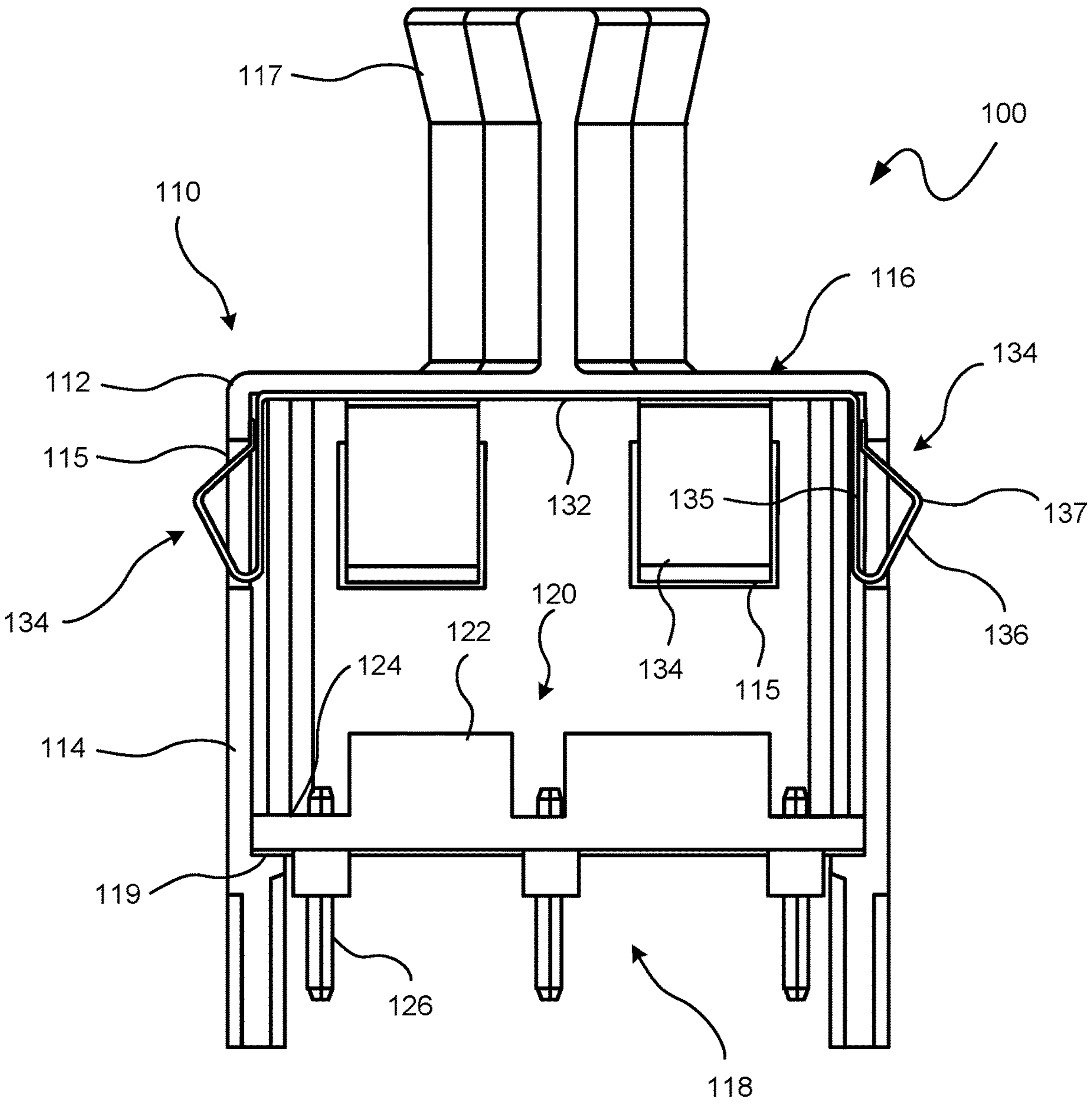
FIG. 4 is a cross-sectional view of the RF component with integrated EMI shielding taken along line 4-4 in FIG. 3.
Figure 5:
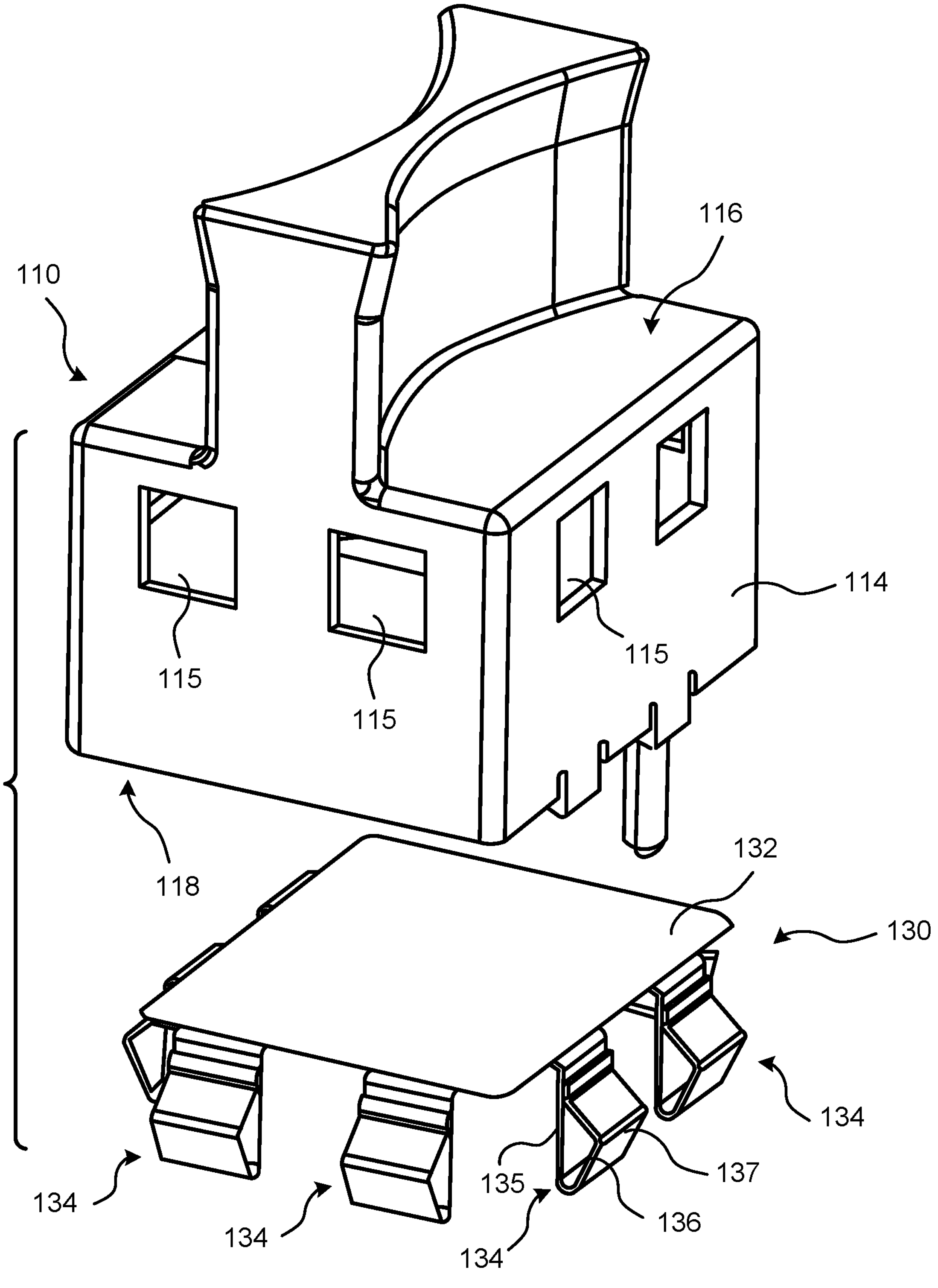
FIG. 5 is an exploded view of the RF component with integrated EMI shielding shown in FIG. 1 showing the EMI shield separated from the component housing.

As shown in greater detail in FIG. 5, the EMI shield 130 includes a shielding portion 132 located in the component housing 110 and engaging members 134 extending from the shielding portion 132. In the illustrated embodiment, the shielding portion 132 is located inside the body portion 112 of the housing 110, as shown in FIG. 4, and the engaging members 134 extend to outside the housing 110 through the apertures 115 defined by the side walls 114 of the body portion 112, as shown in FIGS. 1-4. The engaging members 134 contact an amplifier chassis (not shown) for securing the RF component 100 to the amplifier chassis and for grounding the EMI shield to the amplifier chassis, as will be described in greater detail below. Although the illustrated embodiment shows two engaging members 134 extending through each of the side walls 114, any number of engaging portions may be used on any number of the side walls, provided that the RF component 100 is adequately secured and grounded.

The shielding portion 132 and the engaging portions 134 may be formed as one piece from a conductive material, such as stainless steel or phosphor bronze, capable of providing the EMI shielding. In the illustrated embodiment, the shielding portion 132 has a substantially flat configuration and shape that conforms to the inside of the body 112 of the housing 110. The shielding portion 132 may be spaced as far as possible from the RF component circuit 120 to prevent the EMI shield 130 from creating a capacitance effect and shorting useful RF signals. In one example, the shielding portion 132 is spaced from the RF component circuit 120 at a distance in a range of about 0.625 in. to 1 in. As shown in FIG. 4, the shielding portion 132 may be positioned against the closed top end 116 inside the body 112 of the component housing 110 to maximize the spacing from the RF component circuit 120.

In the illustrated embodiment, the engaging members 134 have a leaf spring configuration including a first portion 135 extending from the shielding portion 132 and a second portion 136 folded back against the first portion 135. The second portion 136 has a bend 137 that protrudes and engages the amplifier chassis, as will be described in greater detail below. This shape and configuration allows the engaging members 134 to be spring-biased against the chassis to secure the RF component 100 and to provide sufficient electrical contact for grounding. Other types and configurations of engaging members are also contemplated and within the scope of the present disclosure.

The RF component circuit 120 may include circuit components 122 on a circuit board 124 and electrical contacts 126 extending from the circuit components 122 and the circuit board 124, for example, for electrically connecting to amplifier circuitry. In the illustrated embodiment, the circuit board 124 of the RF component circuit 120 is supported at the open end 118 of the component housing 110 such that the circuit components 122 are inside the body 112 of the housing 110 and the electrical contacts 126 (e.g., pins) extend from the open end 118 of the housing 110. The circuit board 124 may be supported by a portion 119 of the housing 110 proximate the open end 118, as shown in FIG. 4. The RF component circuit 120 may include a diplexer circuit used to separate forward and reverse RF signals in an RF amplifier in an HFC network. Other RF components, circuits and configurations are contemplated and within the scope of the present disclosure.

Figure 6:
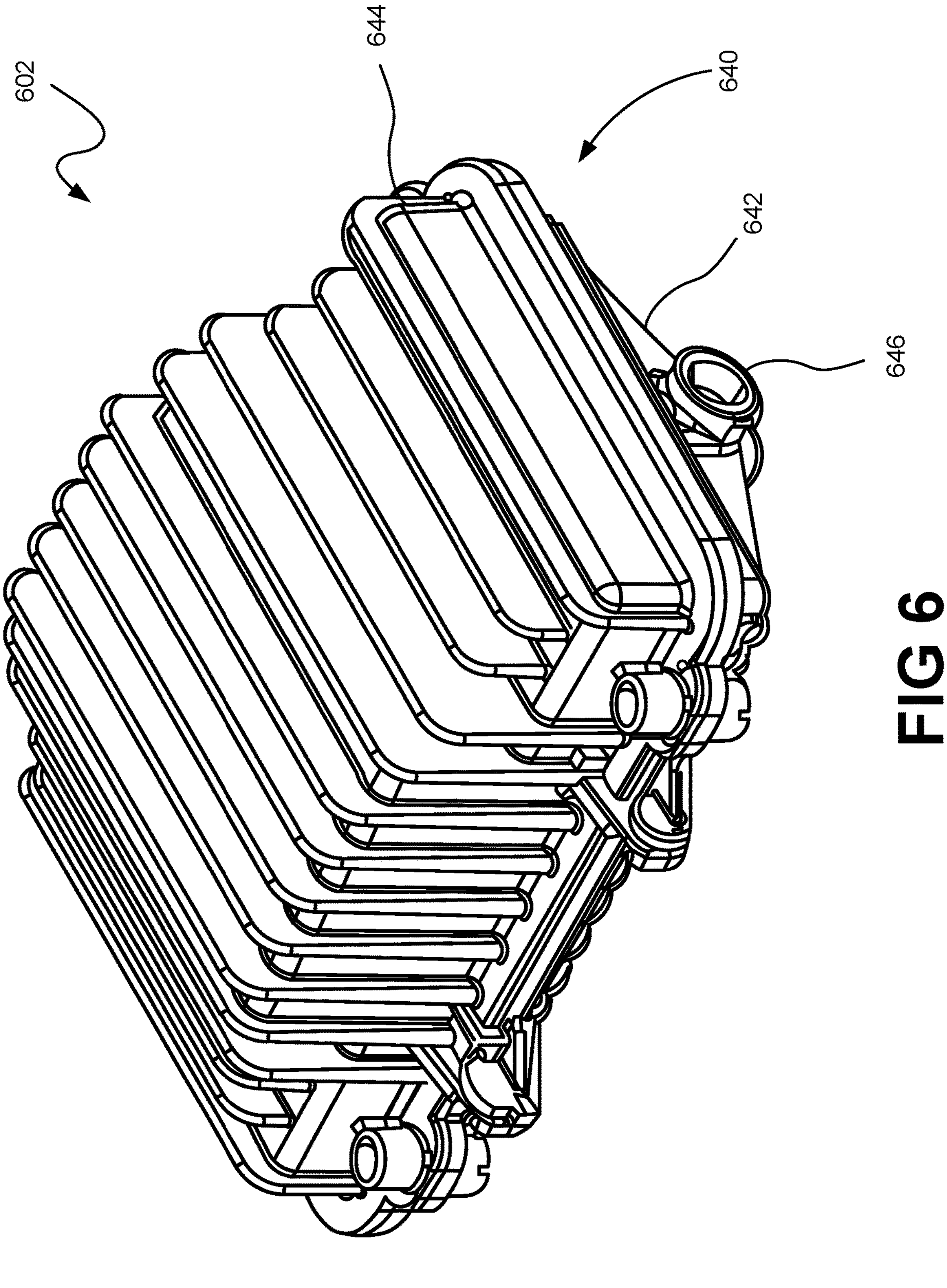
FIG. 6 is a perspective view of an RF amplifier that may include an RF component with integrated EMI shielding, consistent with embodiments of the present disclosure.

Referring to FIGS. 6-10, an RF amplifier 602 including diplex filters or diplexers 600*a*, 600*b* with integrated EMI shielding is shown and described in greater detail. The RF amplifier 602 generally includes an amplifier housing 640 containing amplifier circuitry 650. As shown in FIG. 6, one example of the amplifier housing 640 may include first and second housing portions 642, 644 that are pivotably coupled to allow the housing 640 to be closed for protecting the amplifier circuitry and opened for servicing. The amplifier housing may include ports 646 for connecting to coaxial cables (not shown) that provide an electrical path carrying forward and reverse RF signals.

Figure 7:
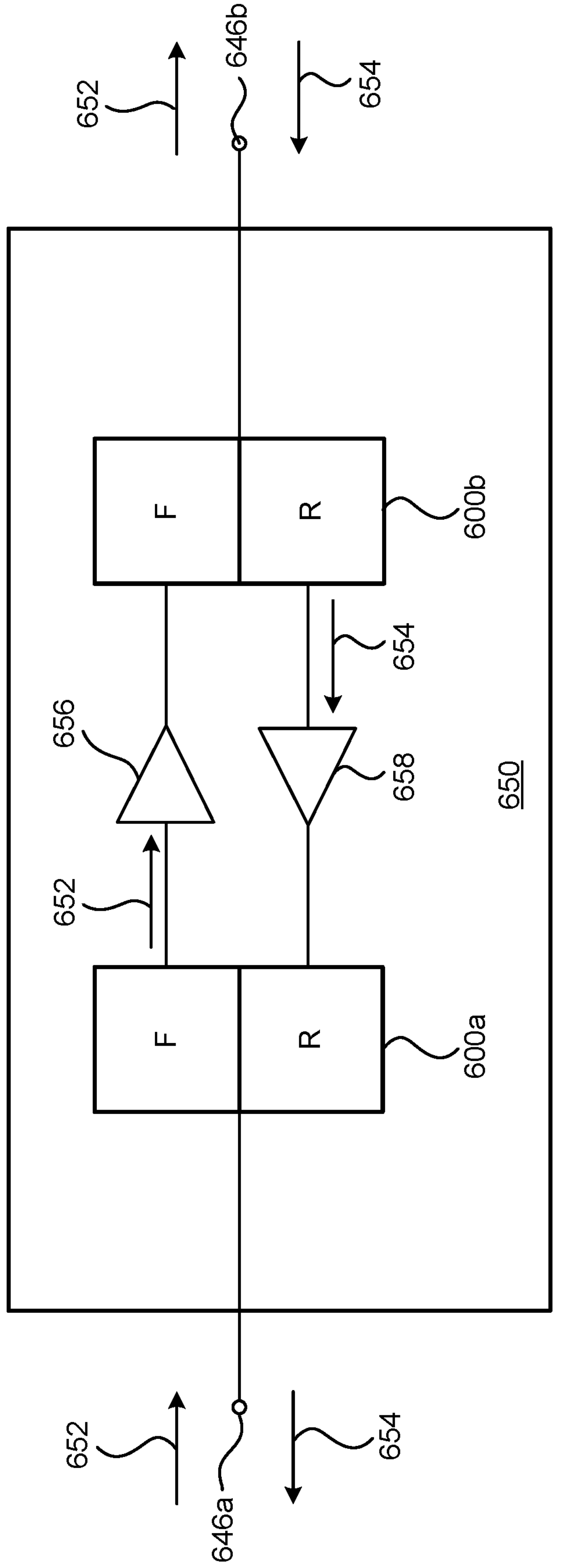
FIG. 7 is a schematic illustration of RF amplifier circuitry that may be used in the RF amplifier in FIG. 6.

As shown schematically in FIG. 7, the RF amplifier circuitry 650 inside the RF amplifier 602 may be coupled to the ports 646*a*, 646*b* for receiving forward and reverse RF signals 652, 654, for example, carried on a coaxial cable downstream and upstream in an HFC/CATV network. The first port 646*a* provides an input for forward signals 652 and an output for reverse signals 654, and the second port 646*b* provides an input for reverse signals 654 and an output for forward signals 652. The RF amplifier circuitry 650 further includes a first diplexer 600*a* coupled to the port 646*a*, a second diplexer 600*b* coupled to the port 646*b*, and forward and reverse gain stages 656, 658 coupled between the diplexers 600*a*, 600*b*. The diplexers 600*a*, 600*b* separate the forward and reverse signals traveling on the same electrical path at the ports 646*a*, 646*b*. In particular, the first diplexer 600*a* separates and passes the forward signals 652 received on the first port 646 for amplification by the forward gain stage 656, and the second diplexer 600*b* separates and passes the reverse signals 654 received on the second port 648 for amplification by the reverse gain stage 658. The diplexers and gain stages may be implemented using known circuit components in RF amplifiers.

Figure 8:
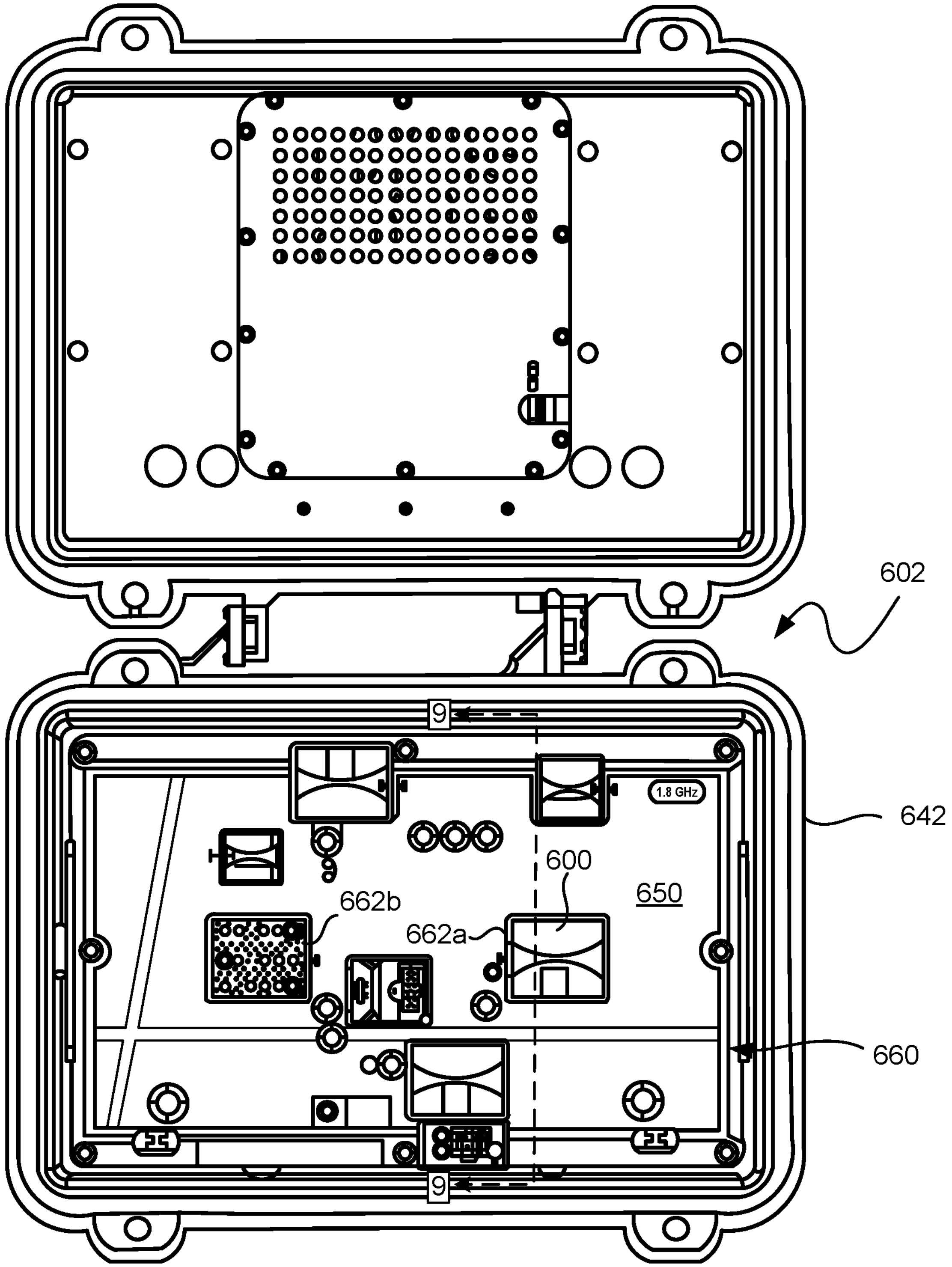
FIG. 8 is a plan view of the inside of the RF amplifier in FIG. 6.

As shown in FIG. 8, the RF amplifier circuitry 650 is located inside the amplifier housing 640 with an amplifier chassis 660, for example, in one of the housing portions 642. An amplifier circuit board (not shown in FIG. 8) is also located in the housing portion 642 inside the amplifier chassis 660, as will be described below. The amplifier chassis 660 includes sockets 662*a*, 662*b* for receiving diplexers 600 as well as other RF components known for use in RF amplifiers. In the illustrated embodiment, one of the sockets 662*a* includes the diplexer 600 and one of the sockets 662*b* is empty. As shown, the RF amplifier circuitry 650 may include other RF components, such as a plug in high pass filter/trim component, a plug in low pass filter/trim component, a plug in frequency equalization module, or any other plug-in RF component, similarly engaged with sockets in the amplifier chassis. These other RF components may also include an integrated EMI shield as disclosed herein.

Figure 9:
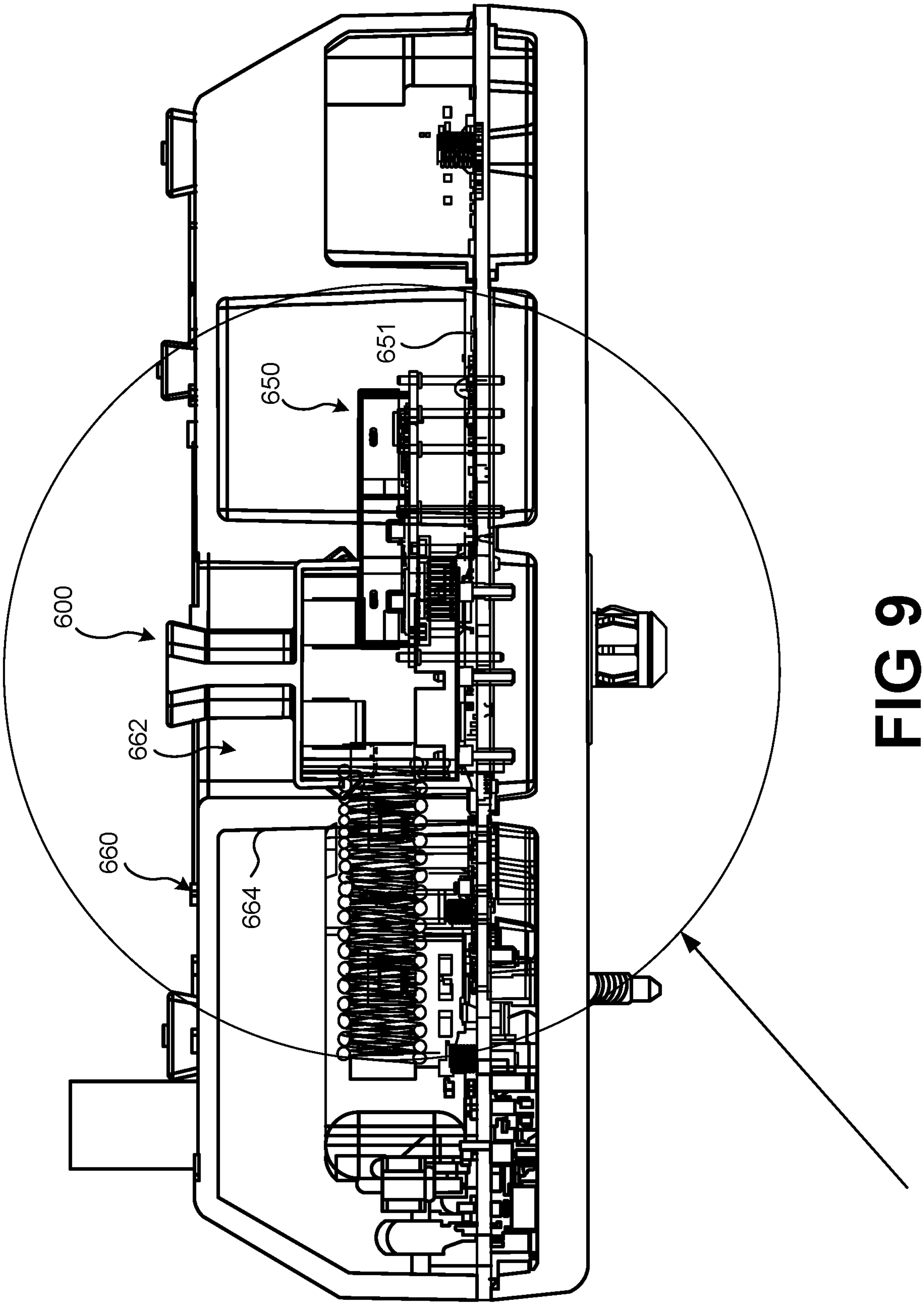
FIG. 9 is a cross-sectional view of the RF amplifier taking along line 9-9 in FIG. 8 showing the amplifier chassis and the RF component with integrated EMI shielding.
Figure 10:
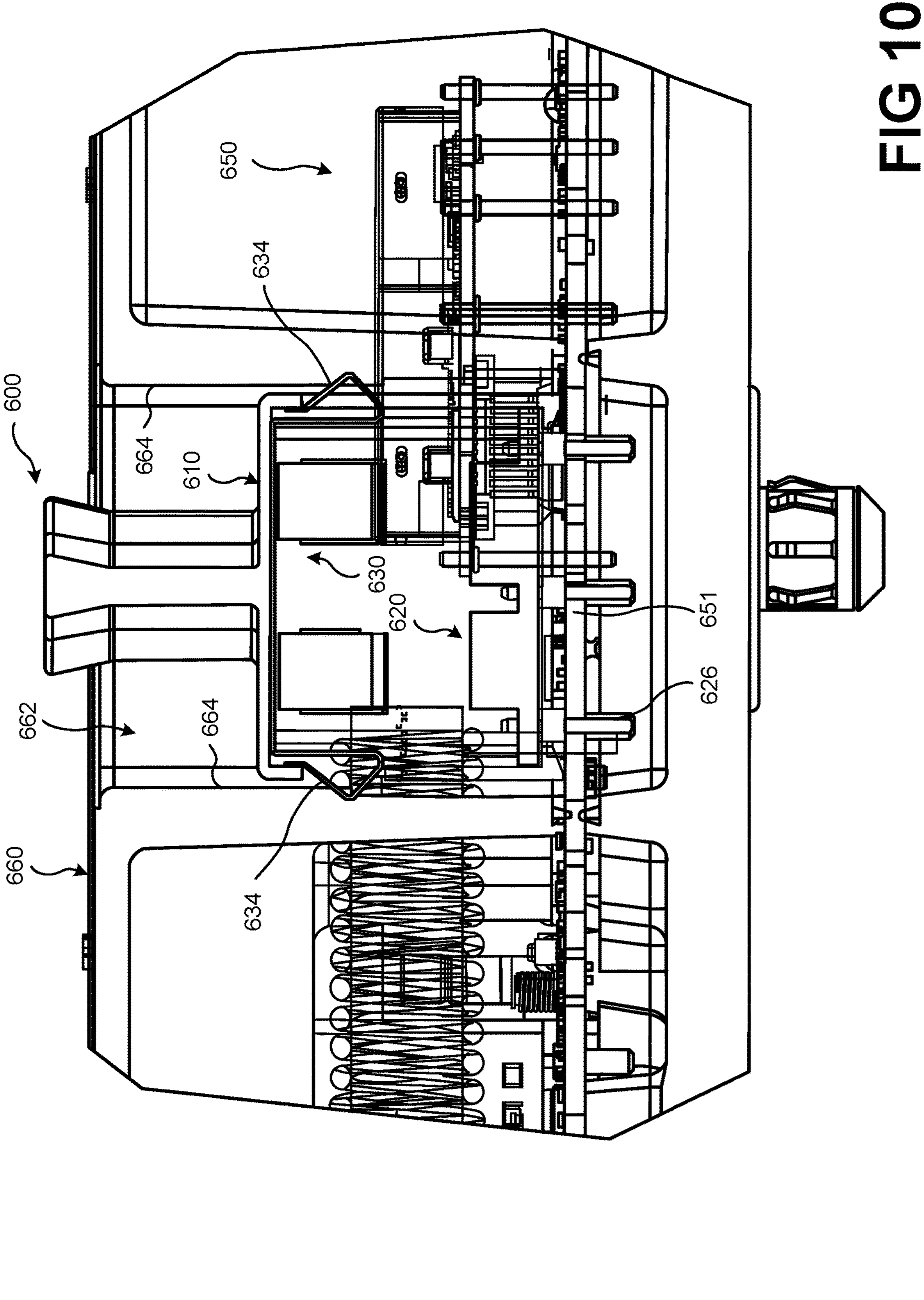
FIG. 10 is an expanded view of FIG. 9 showing the RF component with integrated EMI shielding engaged with the amplifier chassis.

FIGS. 9 and 10 show a cross-section of the amplifier chassis 660 including an amplifier circuit board 651 inside the chassis 660 and the diplexer 600 in the socket 662. The diplexer 600 is electrically connected with the amplifier circuit board 651 and engaged with chassis walls 664 inside the socket 662. As described above, the diplexer 600 includes a housing 610 and an EMI shield 630 with engaging members 634 extending from the housing 610 to engage the chassis walls 664 inside the socket 662. The diplexer 600 includes a diplexer circuit 620 having electrical contacts 626 (e.g., pins) that engage and are electrically connected to contacts on the amplifier circuit board 651. The engaging members 634 thus secure the diplexer 600 in the socket 662 of the chassis 660 while also providing an electrical connection to the chassis 660 for grounding. The diplexer 600 may be easily removed from the chassis 660 without having to disconnect an EMI shield and the EMI shield 630 remains integrated with the diplexer 600.

Accordingly, an RF component with integrated EMI shielding, consistent with embodiments of the present disclosure, improves EMI shielding of an RF component, such as a diplexer, in an RF amplifier without requiring a separate EMI shield on top of and covering the RF component.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A radio frequency (RF) amplifier comprising:

an amplifier chassis;

amplifier circuitry supported by the amplifier chassis and coupled to an RF signal path, wherein the amplifier circuitry includes at least one RF component for receiving at least one RF signal carried on the RF signal path, the at least one RF component includes:

a component housing made of a dielectric material;

an RF component circuit at least partially disposed in the component housing; and an electromagnetic interference (EMI) shield including a shielding portion located in the component housing and spaced from the RF component circuit and engaging members extending from the shielding portion inside the component housing to outside of the component housing, wherein the engaging members contact the amplifier chassis for securing the RF component to the amplifier chassis and for grounding the EMI shield to the amplifier chassis.

2. The RF amplifier of claim 1 wherein the RF component includes a diplexer.

3. The RF amplifier of claim 1 wherein the RF component includes an RF filter component.

4. The RF amplifier of claim 1 further comprising an amplifier housing, wherein the amplifier chassis and amplifier circuitry is located in the amplifier housing.

5. The RF amplifier of claim 1 further comprising a first port for receiving a forward RF signal and for outputting a reverse RF signal and a second port for outputting the forward RF signal and for receiving the reverse RF signal, and wherein the RF component receives at least one of the forward RF signal and the reverse RF signals.

6. The RF amplifier of claim 5, wherein the amplifier circuitry is configured to amplify forward RF signals including the forward RF signal at frequencies up to 1.8 GHz and to amplify reverse RF signals including the reverse RF signal at frequencies up to 600 MHz.

7. The RF amplifier of claim 1 wherein the amplifier circuitry further includes at least one gain stage for amplifying the at least one RF signal.

8. The RF amplifier of claim 1 wherein the shielding portion is positioned against a top end of the component housing.

9. The RF amplifier of claim 1 wherein the shielding portion and the engaging members are formed as one piece from a conductive material.

10. The RF amplifier of claim 9 wherein the engaging members have a leaf spring configuration that biases the engaging members against the amplifier chassis.

11. The RF amplifier of claim 1 wherein the component housing includes a body portion defining apertures, and wherein the shielding portion is located inside of the body portion and the engaging members extend through the apertures.

12. The RF amplifier of claim 11 wherein the component housing further includes a gripping portion at a top end of the body portion for gripping the RF component to remove and insert the RF component.

13. The RF amplifier of claim 11 wherein the shielding portion is located inside the body portion proximate the top end of the body portion, and wherein the RF component circuit is located at least partially inside the body portion proximate a bottom end of the body portion.

14. An electromagnetic interference (EMI)-shielded diplexer comprising:

a housing made of a dielectric material;

a diplexer circuit at least partially disposed in the housing; and an EMI shield including a shielding portion located in the housing and spaced from the diplexer circuit and engaging members extending from the shielding portion inside the housing to outside of the housing, wherein the engaging members are configured to contact a chassis that receives the diplexer for securing the diplexer to the chassis and for grounding the EMI shield to the chassis.

15. The diplexer of claim 14 wherein the diplexer circuit is configured to be coupled to an RF signal path carrying both a forward radio frequency (RF) signal and a reverse RF signal and is configured to separate the forward RF signal from the reverse RF signal.

16. The diplexer of claim 15 wherein the diplexer circuit is configured to receive and separate forward RF signals including the forward RF signal at frequencies up to 1.8 GHz and reverse RF signals including the reverse RF signal at frequencies up to 600 MHz.

17. The diplexer of claim 14 wherein the shielding portion is positioned against a top end of the housing.

18. The diplexer of claim 14 wherein the shielding portion and the engaging members are formed as one piece from a conductive material.

19. The diplexer of claim 18 wherein the engaging members have a leaf spring configuration that biases the engaging members against the chassis.

20. The diplexer of claim 14 wherein the housing includes a body portion defining apertures, and wherein the shielding portion is located inside of the body portion and the engaging members extend through the apertures.

* * * * *